(12) United States Patent
Selgi et al.

(10) Patent No.: US 10,345,158 B2
(45) Date of Patent: Jul. 9, 2019

(54) INTEGRATED ELECTRONIC DEVICE COMPRISING A TEMPERATURE TRANSDUCER AND METHOD FOR DETERMINING AN ESTIMATE OF A TEMPERATURE DIFFERENCE

(71) Applicant: STMicroelectronics S.R.L., Agrate Brianza (IT)

(72) Inventors: Lorenzo Maurizio Selgi, Fiumefreddo di Sicilia (IT); Davide Giuseppe Patti, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 622 days.

(21) Appl. No.: 14/958,620

(22) Filed: Dec. 3, 2015

(65) Prior Publication Data

US 2016/0299013 A1 Oct. 13, 2016

(30) Foreign Application Priority Data

Apr. 7, 2015 (IT) .............................. TO2015A0205

(51) Int. Cl.
*G01K 7/00* (2006.01)
*G01K 3/00* (2006.01)
*G01K 7/01* (2006.01)
*H01L 27/08* (2006.01)
*G01K 3/14* (2006.01)

(52) U.S. Cl.
CPC ............... *G01K 7/015* (2013.01); *G01K 3/14* (2013.01); *G01K 7/01* (2013.01); *H01L 27/0814* (2013.01)

(58) Field of Classification Search
USPC ............................ 374/178, 1, 166, 110, 112
See application file for complete search history.

(56) References Cited

U.S. PATENT DOCUMENTS

2014/0341257 A1 11/2014 Bernardinis

FOREIGN PATENT DOCUMENTS

EP 0 479 362 A2 4/1992
GB 2 032 109 A 4/1980

*Primary Examiner* — Mirellys Jagan
(74) *Attorney, Agent, or Firm* — Seed IP Law Group LLP

(57) ABSTRACT

An integrated electronic device including an electronic component and a temperature transducer formed in a first die. The temperature transducer including a first diode and a second diode which are connected in antiparallel.

19 Claims, 3 Drawing Sheets

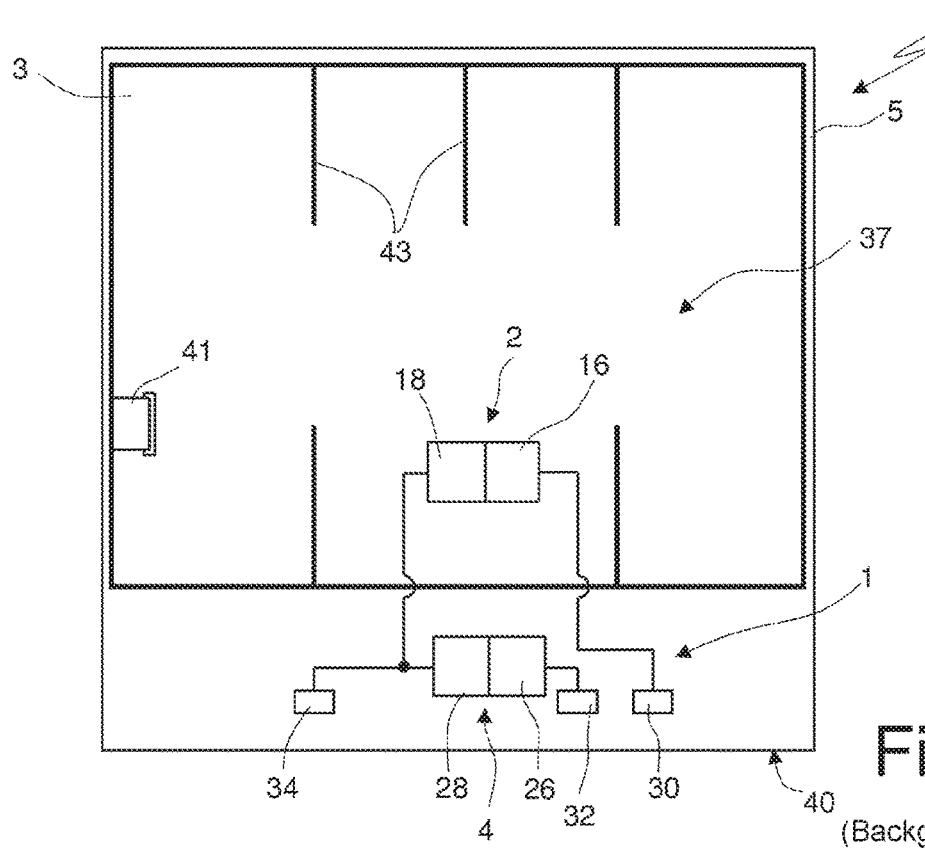
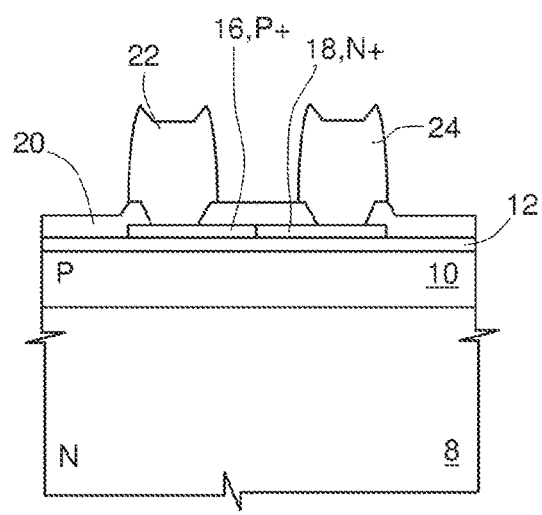
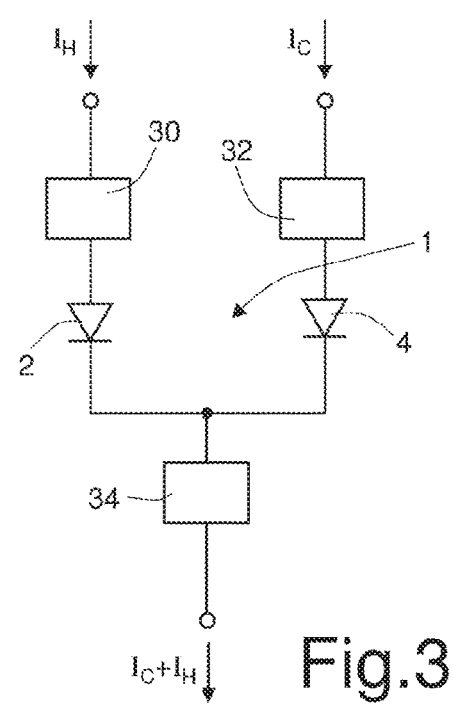
Fig.1 (Background Art)
Fig.2 (Background Art)
Fig.3 (Background Art)

INTEGRATED ELECTRONIC DEVICE COMPRISING A TEMPERATURE TRANSDUCER AND METHOD FOR DETERMINING AN ESTIMATE OF A TEMPERATURE DIFFERENCE

BACKGROUND

Technical Field

The present disclosure relates to an integrated electronic device comprising a temperature transducer. In addition, the present disclosure regards a method for determining an estimate of a difference of temperature.

Description of the Related Art

As is known, today there exist semiconductor devices that each include an electronic component and at least one temperature transducer, which enables detection of a gradient (i.e., a difference) of temperature between two different points of the semiconductor device. In this way, during use of the electronic component, it is possible to determine whether it is necessary to implement strategies that prevent any damage to the semiconductor device.

For instance, illustrated in FIG. 1 are a temperature transducer 1 and an electronic component 3, which form an integrated electronic device 6; for example, the electronic component 3 is a power MOSFET.

The temperature transducer 1 includes a first diode 2 and a second diode 4, which are formed within a die 5, formed inside which is the integrated electronic device 6.

The first and second diodes 2, 4 may be of polysilicon. For instance, as illustrated in FIG. 2, the die 5 includes an epitaxial region 8, for example of an N type, extending on which is a body region 10, for example of a P type. Extending on the body region 10 is a dielectric region 12, made for example of thermal oxide. This having been said, the first diode 2 is formed by a first anode region 16, of polysilicon and with doping of a P+ type, and by a first cathode region 18, of polysilicon and with doping of an N+ type. The first anode region 16 and the first cathode region 18 extend on the dielectric region 12. A top region 20, made for example of a phosphosilicate glass, extends on the dielectric region 12 and part of the first diode 2. An anode metallization 22 and a cathode metallization 24 extend through the top region 20 for contacting the first anode region 16 and the first cathode region 18, respectively.

As illustrated in FIG. 1, the second diode 4 is formed by a second anode region 26 and by a second cathode region 28. Furthermore, the first and second anode regions 16, 26 are electrically connected, respectively, to a first pad 30 and a second pad 32 of conductive material, whereas the first and second cathode regions 18, 28 are electrically connected to a third pad 34. In addition, the first diode 2 is arranged within the active area 37 of the electronic component 3, i.e., in a central area of the die 5, whereas the second diode 4 is arranged in the proximity of an edge 40 of the die 5, i.e., in a peripheral area of the die 5, outside the active area 37. By way of example, FIG. 1 likewise shows a so-called "gate pad" 41 of the electronic component 3, as well as the so-called "gate finger" 43. Further, the electrical connections between the first and second diodes 2, 4 and the first, second, and third pads 30, 32, 34 are illustrated qualitatively. FIG. 3 shows, instead, an equivalent electrical diagram of the temperature transducer 1.

In use, the first, second, and third pads 30, 32, 34 may be electrically connected to a controller (not illustrated) designed to inject in the first and second pads 30, 32 a first current $I_H$ and a second current $I_c$ respectively. The controller is thus designed to forward bias the first and second diodes 2, 4. In addition, the controller collects on the third pad 34, a current equal to $I_H+I_C$. In addition, albeit not illustrated, the controller is electrically coupled to the first and second diodes 2, 4 for detecting a first voltage $V_{F1}$, across the first diode 2, and a second voltage $V_{F2}$, across the second diode 4. Assuming that the first and second diodes 2, 4 operate in the proximity of the respective threshold voltages, each of the first and second voltages $V_{F1}$, $V_{F2}$ decreases by approximately 2 mV per degree centigrade.

Since the first and second voltages $V_{F1}$, $V_{F2}$ depend upon the temperature of the first and second diodes 2, 4, respectively, the controller may detect onset of situations that are potentially dangerous for operation of the electronic component 3, on the basis of the first and second voltages $V_{F1}$, $V_{F2}$. In particular, assuming, for example, that the integrated electronic device 6 is shorted, there is a rapid increase in temperature of the first diode 2, while the temperature of the second diode 4 increases more slowly. A difference is thus created between the temperatures of the first and second diodes 2, 4, which tends to increase over time. In other words, a temperature gradient presents within the die 5 and may be detected by the controller, on the basis of the first and second voltages $V_{F1}$, $V_{F2}$. Once an anomalous condition of use of the electronic component 3 is detected, the controller may co-operate with the driving circuit (not illustrated) of the electronic component 3 in order to implement a technique of protection or the electronic component 3. For example, it is possible for the electronic component 3 to be turned off.

In practice, the temperature transducer 1 transduces a difference of temperature into a voltage difference. In this connection, it is possible to show that detection of a temperature gradient, instead of detection of the absolute temperature of a single point of the integrated electronic device 6, enables reduction of the time that elapses between onset of an anomalous condition of use of the electronic component 3 and subsequent implementation of a protection technique. However, the temperature transducer 1 requires three pads, and thus entails a certain consumption of area of the die 5.

BRIEF SUMMARY

An aim of the present disclosure is thus to provide an integrated electronic device that will overcome at least in part the drawbacks of the known art.

According to the present disclosure, an integrated electronic device and system, and a method for determining an estimate of a difference of temperature are provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIG. 1 is a schematic top plan view with removed portions of a die;

FIG. 2 is a schematic cross-section of a portion of the die illustrated in FIG. 1;

FIG. 3 shows a circuit diagram of a temperature transducer of a known type;

DETAILED DESCRIPTION

Figure 4:
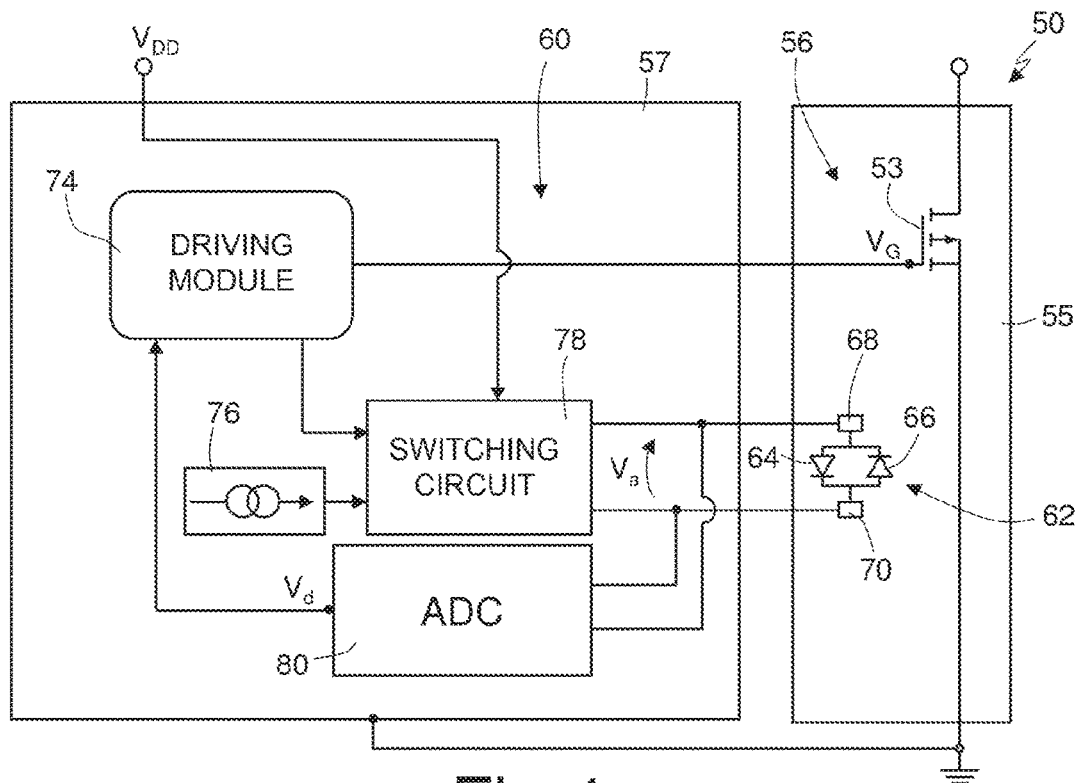
FIGS. 4 and 6 show block diagrams of electronic systems.

FIG. 4 shows an electronic system 50, which includes an integrated electronic device 56, which in turn comprises an electronic component 53 and a temperature transducer 62. Without any loss of generality, the electronic component 53 is a power PMOS transistor. Likewise illustrated schematically in FIG. 4 are a first die 55, formed inside which is the integrated electronic device 56, and a second die 57. The electronic system 50 further comprises a control module 60, formed in the second die 57.

The temperature transducer 62 comprises a first diode 64 and a second diode 66, which are connected in antiparallel between a first pad 68 and a second pad 70 of the first die 55, of conductive material. In particular, the anode and the cathode of the first diode 64 are connected to the first and second pads 68, 70, respectively, whereas the anode and the cathode of the second diode 66 are connected to the second and first pads 70, 68, respectively. In other words, the first and second pads 68, 70 form conductive terminals of the first die 55, which are electrically accessible and may thus be connected to electronic devices external to the first die 55.

The control module 60 comprises a driving module 74, which has an input and a first output and a second output. The first output is connected to the gate terminal of the electronic component 53. The control module 60 further comprises a current generator 76, which is designed to generate a constant current $I_F$, a switching circuit 78, and an analog-to-digital converter 80.

The analog-to-digital converter 80 has a first input and a second input, which are connected to the first and second pads 68, 70, respectively. Furthermore, if we designate by $V_a$ the voltage present between the first and second pads 68, 70, the analog-to-digital converter 80 is configured to generate on its own, a corresponding digital signal $V_d$, as a function of the voltage $V_a$. The output of the analog-to-digital converter 80 is connected to the input of the driving module 74.

The switching circuit 78 has a first input, a second input, and a third input, which are respectively connected to the current generator 76, to the second output of the driving module 74, and to a supply terminal, which in use is set at the voltage $V_{DD}$. Furthermore, the switching circuit 78 has a first output and a second output, which are connected to the first and second pads 68, 70, respectively.

As regards once again the electronic component 53, the drain terminal may be connected to a load (not illustrated), whereas the source terminal is connected to ground. Without any loss of generality, the first and second dice 55, 57 share the ground.

In use, the driving module 74 is designed to apply a voltage $V_G$ to the gate terminal of the electronic component 53 in such a way that present between the gate terminal and the source terminal is a voltage that exceeds the threshold voltage of the electronic component 53. In addition, the driving module 74 generates on its own, a control signal as a second output, of a periodic type with frequency $f_c$. On the basis of the control signal, the switching circuit 78 injects the current $I_F$, generated by the current generator 76, alternatively into the first and second pads 68, 70, i.e., into the first and second diodes 64, 66, with a frequency equal to the frequency $f_c$. For this purpose, the switching circuit 78 is of a per se known type and may, for example, include an electronically controlled bridge circuit (not illustrated).

Figure 5:
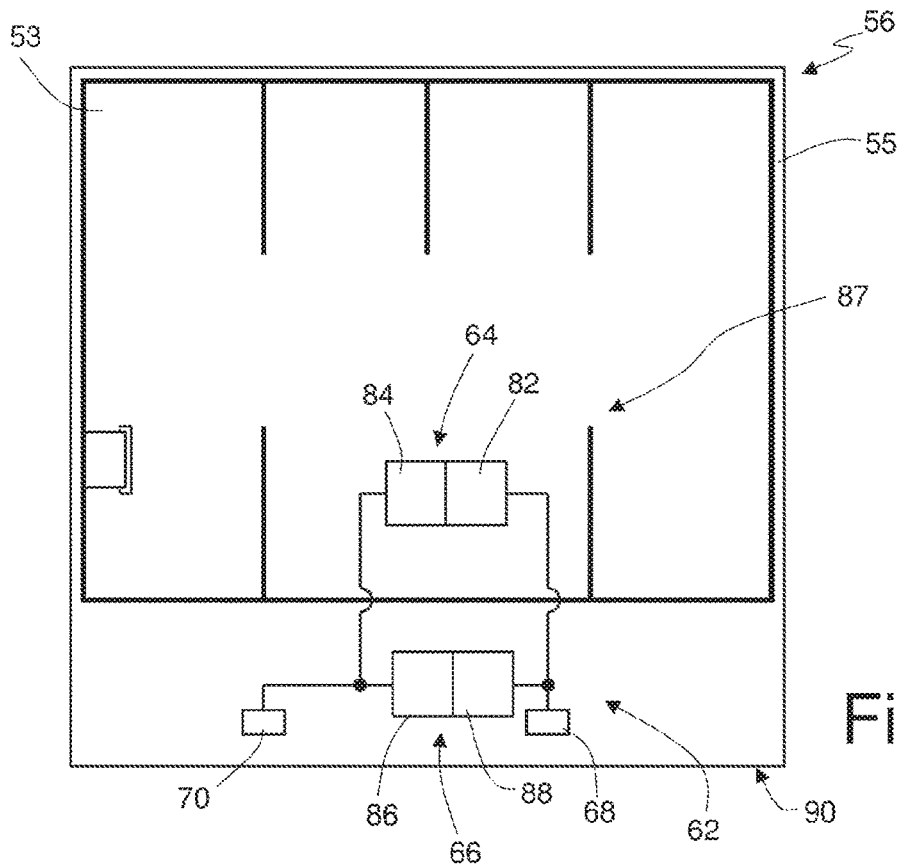
FIG. 5 is a schematic top plan view with portions removed of a die in which an embodiment of the present integrated electronic device is formed.

The first and second diodes 64, 66, may be arranged in the first die 55 as illustrated in FIG. 5, purely by way of example. In particular, in the embodiment illustrated in FIG. 5, the first diode 64 includes a first anode region 82 and a first cathode region 84, which are made, for example, of polysilicon, have a P and an N doping, respectively, and are arranged in the active area 87 of the electronic component 53, i.e., in a central portion, or in any case far from the edges, of the first die 55. In this connection, the active area 87 may, for example, be delimited from the remaining portions of the first die 55 by an insulation region (not illustrated). The first anode region 82 and the first cathode region 84 are connected to the first and second pads 68, 70, respectively. The second diode 66 includes a second anode region 86 and a second cathode region 88, which are made for example of polysilicon, have a doping of a P and an N type, respectively, and are arranged, for example, outside the active area 87, i.e., in a peripheral portion of the first die 55, close to an edge 90 of the first die 55. The second anode region 86 and the second cathode region 88 are connected to the second pad 70 and to the first pad 68, respectively.

Purely by way of example, each of the first and second diodes 64, 66 may be electrically separated from the other semiconductor portions (not illustrated) of the first die 55. For example, each of the first and second diodes 64, 66 may overlie, in direct contact, a dielectric region (not illustrated) of the first die 55 and may be partially overlaid, in direct contact, by a top region (not illustrated) made, for example, of a phosphosilicate glass.

In use, the temperature transducer 62 is driven with a constant current equal to the current $I_F$. Furthermore, at each instant, just one of the first and second diodes 64, 66 operates in forward biasing, whereas the other is reverse biased. Assuming that the first and second diodes 64, 66 are the same and thus have a same threshold voltage $V_\gamma$, at each instant one of the first and second diodes 64, 66 is reverse biased with a voltage approximately equal, in modulus, to the threshold voltage $V_\gamma$, but remains in any case outside the breakdown region. Consequently, to a first approximation it may be assumed that, at each instant, the current $I_F$ traverses only one of the first and second diodes 64, 66.

This having been said, in what follows there are considered by way of example an instant $t_1$ of a half-period in which the current $I_F$ traverses the first diode 64 and an instant $t_2$ of the subsequent half-period, in which the current $I_F$ traverses the second diode 66. It is further assumed that, at the instant $t_1$, the first and second diodes 64, 66 are at the temperatures $T_{64}'$ and $T_{66}'$, respectively, and that at the instant $t_2$ the first and second diodes 64, 66 are at the temperatures $T_{64}''$ and $T_{66}''$, respectively. At the instant $t_1$ there is thus a temperature gradient $\Delta T_1 = T_{64}' - T_{66}'$, whereas at the instant $t_2$ there is a temperature gradient $\Delta T_2 = T_{64}'' - T_{66}''$. For completeness, it is further assumed that, in the case where the voltage $V_G$ present on the gate terminal of the electronic component 53 is variable in a periodic way with a frequency $f_s$, we have $f_c > \text{cost} \cdot f_s$, where, for example, cost=10.

This having been said, at the instants $t_1$ and $t_2$ we find $V_a = V_1'$ and $V_a = V_2'$, respectively. At the same instants, at output from the analog-to-digital converter 80 we have $V_d = V_1''$ and $V_d = V_2''$, respectively. Without any loss of generality, it is assumed that the values expressed by the quantities $V_1'$ (analog) and $V_1''$ (digital) are the same, as also are the values of the quantities $V_2'$ (analog) and $V_2''$ (digital). Assuming that the frequency $f_c$ is high with respect to the evolution in time of the aforementioned temperature gradient, and thus assuming that the temperature gradients $\Delta T_1$ and $\Delta T_2$ are to a first approximation the same, it is possible to determine an estimate of these latter. In addition, for practical purposes, the analog-to-digital converter 80 functions as voltage detector.

In detail, the driving module 74 determines an estimate of temperature gradient, on the basis of the values $V_1''$ and $V_2''$ of the digital signal $V_d$ generated by the analog-to-digital converter 80, and thus on the basis of the voltages $V_1'$ and $V_2'$ present across the temperature transducer 62 at the instants $t_1$ and $t_2$. For this purpose, the driving module 74 may, for example, store a first law of variation and a second law of variation, which regard, respectively, the first diode 64 and the second diode 66. Each law of variation may be stored, for example, in a corresponding look-up table, or else may be stored in the form of a corresponding mathematical relation. Irrespective of the details regarding storage, the driving module 74 determines: i) an estimate of the temperature $T_{64}'$ of the first diode at the instant $t_1$, on the basis of the value $V_1$; and ii) an estimate of the temperature $T_{66}'$ of the second diode 66 at the instant $t_2$, on the basis of the value $V_2''$. Next, the driving module 74 calculates the difference between the estimate of the temperature $T_{64}'$ and the estimate of the temperature $T_{66}''$ to obtain an estimate of the difference between the temperatures of the first and second diodes 64, 66, referred to hereinafter as "estimate of the gradient".

Optionally, the driving module 74 may compare the estimate of the gradient with a limit difference. If the estimate of the gradient is less than the limit difference, the driving module 74 continues to keep the electronic component 53 in conduction. Instead, if the estimate of the gradient is greater than or equal to the limit difference, the driving module 74 implements a technique of protection of the electronic component 53. For instance, the driving module 74 turns the electronic component 53 off. In any case, also on the hypothesis where the driving module 74 does not implement any protection technique, the estimate of the aforementioned temperature gradient enables a monitoring to be carried out that is useful for diagnostic purposes.

From what has been described and illustrated previously, the advantages that the present solution affords emerge clearly.

In particular, the temperature transducer 62 is connected to just two pads, with consequent reduction of costs for manufacture of the integrated electronic device 56, as well as of the area occupied by the integrated electronic device 56. Further, there is a reduction of the assembly costs and of the number of bonding electrodes. The temperature transducer 62 in any case enables the driving module 74 to detect the temperature gradient present between the first and second diodes 64, 66 and thus to implement, if need be, possible techniques of protection of the electronic component 53.

In conclusion, it is clear that modifications and variations may be made to what has been described and illustrated herein, without thereby departing from the scope of the present disclosure.

For instance, instead of the analog-to-digital converter 80, a voltage comparator may be used.

The first and second diodes 64, 66 may have positions different from what has been illustrated herein. Furthermore, the first and second diodes 64, 66 may be different from what has been described. For instance, each of the first and second diodes 64, 66 may be formed within a semiconductor region (not illustrated) of the first die 55, such as for example a body region, and in direct contact with the latter. The first and second diodes 64, 66 may thus be of materials different from polysilicon.

Figure 6:
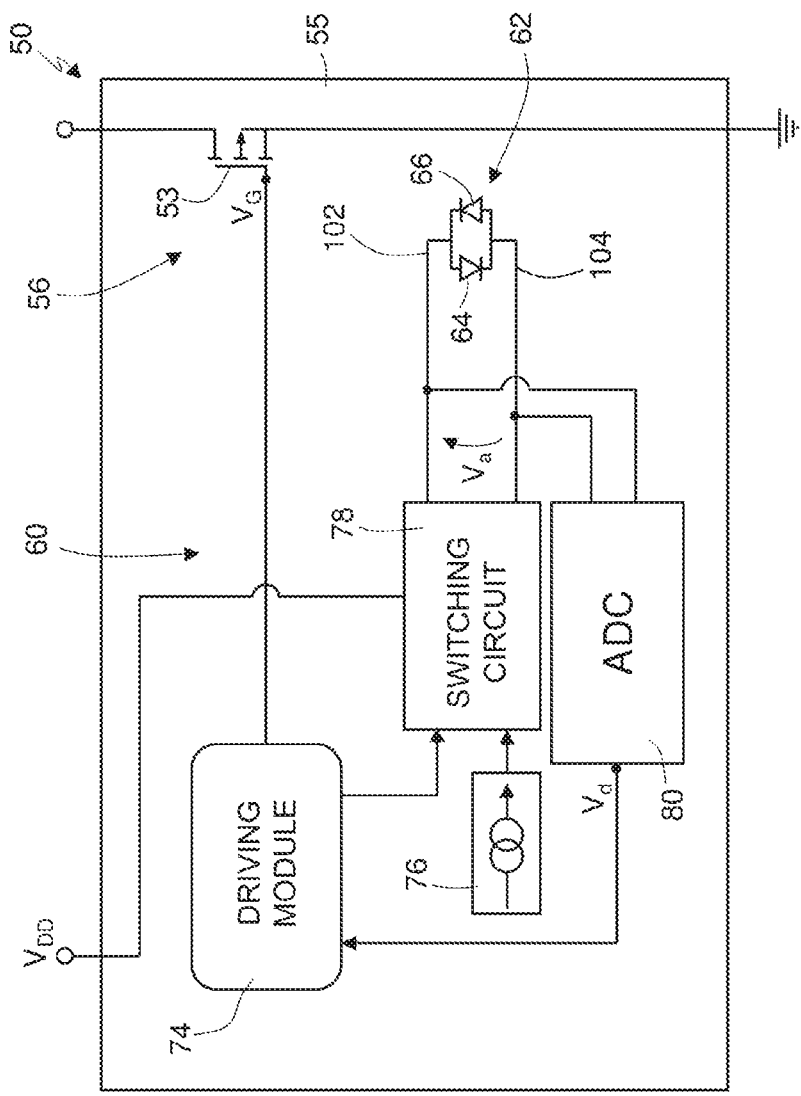

As regards the control module 60, parts thereof may be formed in different dice, instead of in a single die. In addition, it is possible for the control module 60 to be formed in the first die 55, in which case the first and second pads 68, 70, as also the second die 57, may be absent, as illustrated in FIG. 6. The control module 60 is connected to the temperature transducer 62 through a first conductive path 102 and a second conductive path 104.

In addition, as mentioned previously, the electronic component 53 may be other than a power MOS transistor. Purely by way of example, the electronic component 53 may be formed by a JFET, or else by a so-called IGBT. Furthermore, the connections with the electronic component 53 may be different from what has been illustrated. For example, the load may be connected to the source terminal, instead of to the drain terminal, which is connected to a supply terminal.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated electronic device, comprising:
   an electronic component and a temperature transducer formed in a first die, said temperature transducer including a first diode and a second diode connected in antiparallel;
   a current generator configured to inject a current alternatively into the first diode and into the second diode;
   a detection circuit configured to detect a first voltage present on the temperature transducer at a first instant where said current is injected into the first diode, and to detect a second voltage present on the temperature transducer at a second instant where said current is injected into the second diode; and
   an estimating unit configured to determine an estimate of the difference between the temperature of the first diode and the temperature of the second diode on the basis of said first and second voltages and on a first law of variation of voltage as a function of temperature for the first diode and a second law of variation of voltage as a function of temperature for the second diode, the estimating unit configured to store the first and second laws of variation.

2. The electronic device according to claim 1, wherein the first and second diodes are connected between a first and a second conductive terminals, which are electrically accessible.

3. The integrated electronic device according to claim 1, wherein the first diode is arranged close to an active area of the electrical component; and wherein the second diode is arranged far from the active area of the electrical component.

4. The electronic device according to claim 1, wherein said first and second diodes are electrically insulated from the rest of the first die.

5. An electronic system, comprising:
an integrated electronic device including an electronic component and a temperature transducer, which are formed in a first die, the temperature transducer including a first diode and a second diode, which are connected in antiparallel; and
a control module coupled to the integrated electronic device, the control module comprising:
a current generator configured to inject a current alternatively into the first diode and into the second diode;
a detection circuit configured to detect a first voltage present on the temperature transducer at a first instant where said current is injected into the first diode, and to detect and a second voltage present on the temperature transducer at a second instant where said current is injected into the second diode; and
an estimating unit configured to determine an estimate of a temperature of the first diode at a first time and an estimate of a temperature of the second diode at a second time on the basis of said first and second voltages, and is further configured to calculate a difference between the temperatures of the first and second diodes to estimate the gradient of the temperature between the first and second times.

6. The electronic system according to claim 5, wherein said first instant belongs to a first period of time in which said current is injected into the first diode; and wherein said second instant belongs to a second period of time in which said current is injected into the second diode, said first and second periods of time being contiguous.

7. The electronic system according to claim 5, wherein said control module is formed in a second die.

8. The electronic system of claim 5, wherein the electronic component comprises one of a MOS transistor, JFET transistor, and IGBT transistor.

9. The electronic system of claim 5, wherein the detection circuit comprises an analog-to-digital converter.

10. The electronic system according to claim 5, wherein the control module further comprises a driving circuit configured to drive the electronic component as a function of said estimate of the difference between the temperature of the first diode and the temperature of the second diode.

11. The electronic system of claim 10, wherein the driving circuit is further configured to generate a periodic control signal that is applied to alternately activate and thereby inject current into the first and second diodes.

12. The electronic system of claim 5, wherein the estimating unit further compares the estimate of the gradient to a limit difference and wherein the driving circuit is configured to drive the electronic component as a function of the limit difference.

13. The electronic system of claim 12, wherein the driving circuit continues to drive the electronic component to activate the electronic component in response to the estimate of the gradient being less than the limit difference and wherein the driving circuit drives the electronic component to deactivate the electronic component in response to the estimate of the gradient being greater than or equal to the limit difference.

14. The electronic system of claim 5, wherein the estimating unit stores a first law of variation of voltage as a function of temperature for the first diode and a second law of variation of voltage as a function of temperature for the second diode.

15. The electronic system of claim 14, wherein the estimating unit stores each law of variation as a corresponding look-up table.

16. The electronic system of claim 14, wherein the first law of variation is the same as the second law of variation.

17. An integrated circuit, comprising:
a temperature transducer integrated in a first die, the temperature transducer including first and second antiparallel diodes;
an electronic component in the first die;
a switching circuit coupled to the temperature transducer, the switching circuit configured to alternatively provide a current through the first and second antiparallel diodes, the current being based on a periodic control signal; and
a driving circuit coupled to the switching circuit and configured to generate the periodic control signal, and the driving circuit coupled to the first and second antiparallel diodes and configured to detect a first voltage across the first antiparallel diode in response to the current provided by the switching circuit and to detect a second voltage across the second antiparallel diode in response to the current provided by the switching circuit, and the driving circuit further configured to control the electronic component based on the first and second voltages.

18. The integrated circuit of claim 17, further comprising an analog-to-digital converter coupled to the temperature transducer and configured to generate first and second digital values corresponding to the first and second voltages across the first and second antiparallel diodes, respectively.

19. The integrated circuit of claim 17, wherein the electronic component comprises a power transistor.

* * * * *